United States Patent
Lee

(10) Patent No.: US 11,037,807 B2
(45) Date of Patent: Jun. 15, 2021

(54) APPARATUS FOR TREATING SUBSTRATE

(71) Applicant: Semes Co., Ltd, Cheonan-si (KR)

(72) Inventor: Jong Gu Lee, Sangju-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/505,883

(22) Filed: Jul. 9, 2019

(65) Prior Publication Data

US 2020/0020554 A1 Jan. 16, 2020

(30) Foreign Application Priority Data

Jul. 10, 2018 (KR) .......................... 10-2018-0079906

(51) Int. Cl.
*H01L 21/67* (2006.01)
*H01L 21/687* (2006.01)

(52) U.S. Cl.
CPC .... *H01L 21/67109* (2013.01); *H01L 21/6715* (2013.01); *H01L 21/68707* (2013.01)

(58) Field of Classification Search
CPC ......... H01L 21/67109; H01L 21/67005; H01L 21/67103; H01L 21/67; H01L 21/67098
See application file for complete search history.

(56) References Cited

U.S. PATENT DOCUMENTS

| 10,217,652 B2 * | 2/2019 | Mizuta ........................ F27D 7/04 |
| 2007/0266945 A1 * | 11/2007 | Shuto ................. H01J 37/32091 118/723 E |
| 2010/0255196 A1 * | 10/2010 | Geisler .................... C23C 16/54 427/248.1 |
| 2013/0108975 A1 * | 5/2013 | Kang ................. H01L 21/67017 432/65 |

(Continued)

FOREIGN PATENT DOCUMENTS

| JP | 2011175998 A | 9/2011 |
| KR | 10-2002-0057811 A | 7/2002 |

(Continued)

OTHER PUBLICATIONS

Office Action for Korean Application No. 10-2018-0079906 dated Nov. 13, 2019.

(Continued)

*Primary Examiner* — Kaitlin S Joerger
(74) *Attorney, Agent, or Firm* — Harness, Dickey & Pierce, P.L.C.

(57) ABSTRACT

An apparatus for treating a substrate comprises a process chamber having a processing space inside, a substrate support unit that supports the substrate in the processing space, a heating unit that heats the substrate supported on the substrate support unit, an exhaust unit that evacuates the processing space, and a guide member that guides a gas flow in the processing space. The guide member comprises a blocking plate that is located between an upper wall of the (Continued)

process chamber and the substrate support unit and spaced apart from an inner sidewall of the process chamber and that has a diameter smaller than an inner diameter of the process chamber. The exhaust unit is connected, at a position overlapping the blocking plate, to the upper wall of the process chamber when viewed from above.

12 Claims, 14 Drawing Sheets

(56) References Cited

U.S. PATENT DOCUMENTS

| | | | |
|---|---|---|---|
| 2015/0122177 A1* | 5/2015 | Yang | H01J 37/321 |
| | | | 118/723 I |
| 2018/0090344 A1* | 3/2018 | Kim | H01L 21/3065 |
| 2019/0096639 A1* | 3/2019 | Takahashi | H01J 37/32091 |
| 2019/0096716 A1* | 3/2019 | Iwasaka | H01L 21/67739 |
| 2020/0032386 A1* | 1/2020 | Aderhold | C23C 14/50 |

FOREIGN PATENT DOCUMENTS

| | | |
|---|---|---|
| KR | 10-2007-0078073 A | 7/2007 |
| KR | 100798659 B1 | 1/2008 |
| KR | 20180000928 A | 1/2018 |
| KR | 10-2019-0004494 A | 1/2019 |

OTHER PUBLICATIONS

Notice of Allowance for Korean Application No. 10-2018-0079906 dated Jun. 3, 2020.

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2018-0079906 filed on 10 Jul. 2018, in the Korean Intellectual Property Office, the entire contents of which are hereby incorporated by reference.

BACKGROUND

Embodiments of the inventive concept described herein relate to an apparatus for treating a substrate, and more particularly, relate to an apparatus for heating a substrate.

Various processes such as cleaning, deposition, photolithography, etching, and ion implantation are performed to manufacture semiconductor devices. Among these processes, the photolithography process comprises a process of forming a liquid film, such as a photoresist film, on a substrate.

A bake process of heating the substrate is performed after the formation of the liquid film on the substrate. The bake process is required to uniformly heat the entire region of the substrate. Organic matter contained in the liquid film is volatilized and then evacuated together with a gas flow introduced from the outside.

FIG. 1 is a view illustrating a gas flow direction in a conventional bake apparatus. FIG. 2 is a view illustrating a substrate baked by using the apparatus of FIG. 1. Referring to FIGS. 1 and 2, the gas flow is introduced from outside the substrate W and evacuated upward through the central region of the substrate W. Due to this, there is a temperature difference between the gas flow passing over the edge region of the substrate W and the gas flow passing over the central region of the substrate W. For example, the gas flow passing over the central region of the substrate W has a higher temperature than the gas flow passing over the edge region of the substrate W. The upward central flow evacuation method causes a difference in the amount of organic matter volatilized from the liquid film between regions of the substrate W, and the edge region of the substrate W has a thicker liquid film than the central region thereof.

SUMMARY

Embodiments of the inventive concept provide an apparatus for uniformly heating a liquid film formed on a substrate.

Embodiments of the inventive concept provide an apparatus for solving the problem caused by the upward central flow evacuation method during heat treatment of the substrate.

According to an exemplary embodiment, an apparatus for treating a substrate comprises a process chamber having a processing space inside, a substrate support unit that supports the substrate in the processing space, a heating unit that heats the substrate supported on the substrate support unit, an exhaust unit that evacuates the processing space, and a guide member that guides a gas flow in the processing space. The guide member comprises a blocking plate that is located between an upper wall of the process chamber and the substrate support unit and spaced apart from an inner sidewall of the process chamber and that has a diameter smaller than an inner diameter of the process chamber. The exhaust unit is connected, at a position overlapping the blocking plate, to the upper wall of the process chamber when viewed from above.

The guide member may further comprise a baffle plate located in a spacing space between the blocking plate and the inner sidewall of the process chamber. The baffle plate may be located to be brought into contact with the blocking plate and the inner sidewall of the process chamber, and the baffle plate may have a plurality of baffle holes extending through opposite ends of the baffle plate.

The guide member may further comprise a baffle plate located in a spacing space between the blocking plate and the upper wall of the process chamber. The baffle plate may be located to be brought into contact with the blocking plate and the upper wall of the process chamber, and the baffle plate may have a plurality of baffle holes extending through opposite ends of the baffle plate.

The process chamber may comprise an upper body to which the exhaust unit is connected and a lower body combined with the upper body to form the processing space inside. The lower body may comprise an inner container that surrounds a side portion and a lower portion of the substrate support unit, an outer container that surrounds the inner container and vertically faces the upper body, and an intermediate container that surrounds the inner container and that is located between the inner container and the outer container. The substrate support unit, the inner container, the intermediate container, and the outer container may be located to be spaced apart from each other, and the inner container, the intermediate container, and the outer container may have inflow holes, respectively, through which the gas flow is introduced from outside the process chamber.

According to an exemplary embodiment, an apparatus for treating a substrate comprises a process chamber having a processing space inside, a substrate support unit that supports the substrate in the processing space, a heating unit that heats the substrate supported on the substrate support unit, an exhaust unit that evacuates the processing space, and a guide member that guides a gas flow in the processing space and partitions the processing space into a first space and a second space. The exhaust unit is connected to an exhaust hole formed in an upper wall of the process chamber, and the guide member has baffle holes that connect the first space and the second space. The substrate support unit is located in the first space, and the second space is adjacent to the upper wall of the process chamber that comprises the exhaust hole.

The guide member may comprise a blocked central region and an edge region in which the baffle holes are formed. The edge region may be arranged outside the substrate support unit when viewed from above. The central region and the edge region may be located on the same plane.

The edge region may extend upward from a distal end of the central region.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
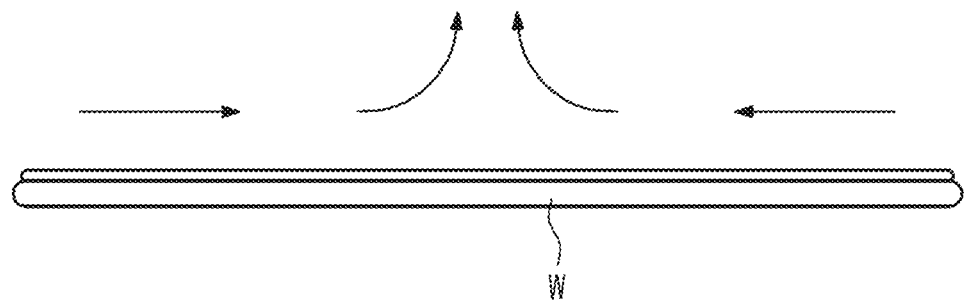
FIG. 1 is a view illustrating a gas flow direction in a conventional bake apparatus.
Figure 2:
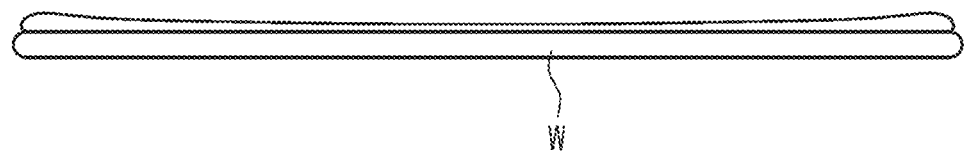
FIG. 2 is a view illustrating a substrate baked by using the apparatus of FIG. 1.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Figure 3:
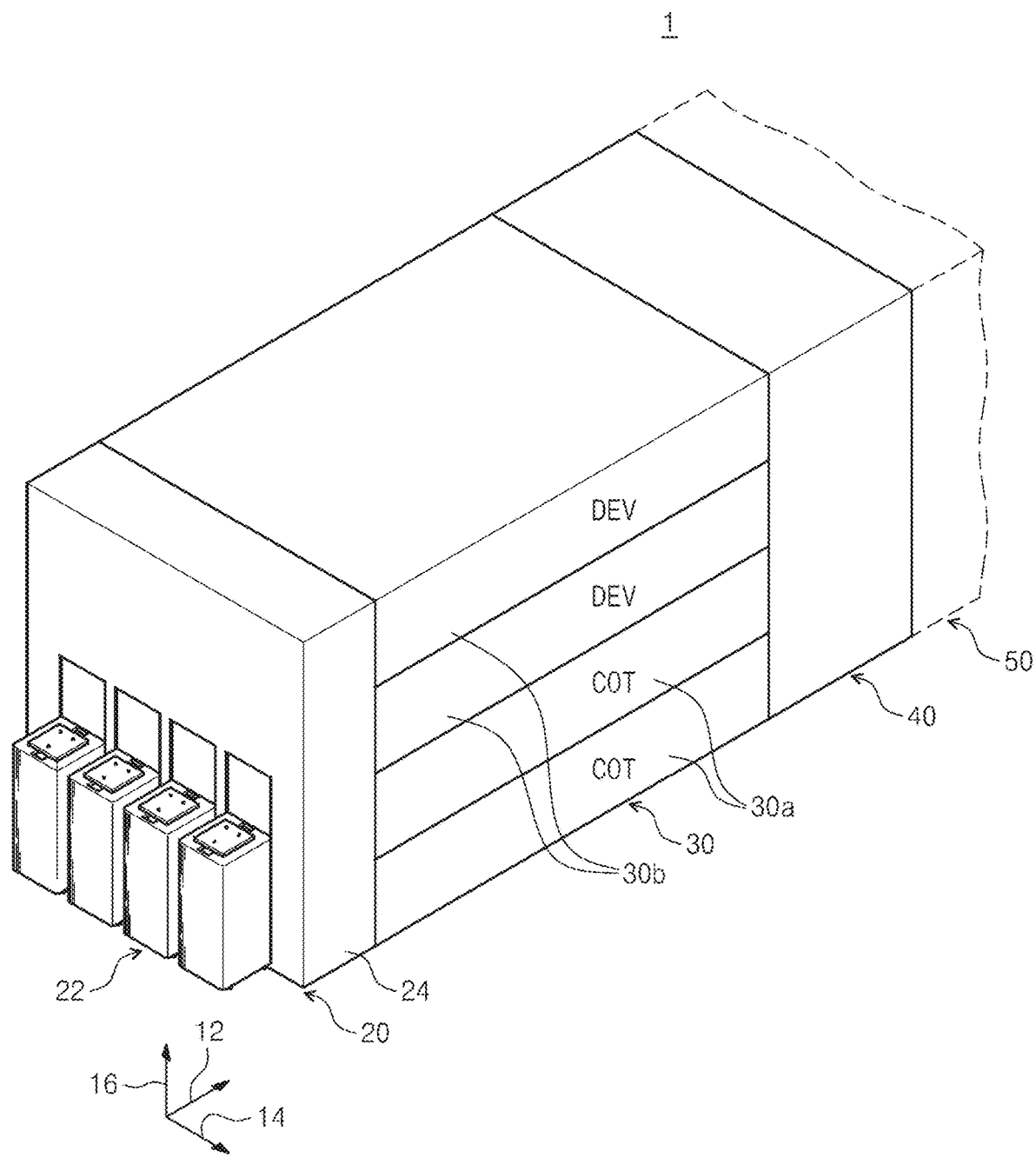
FIG. 3 is a schematic perspective view illustrating a substrate treating apparatus according to an embodiment of the inventive concept.
Figure 4:
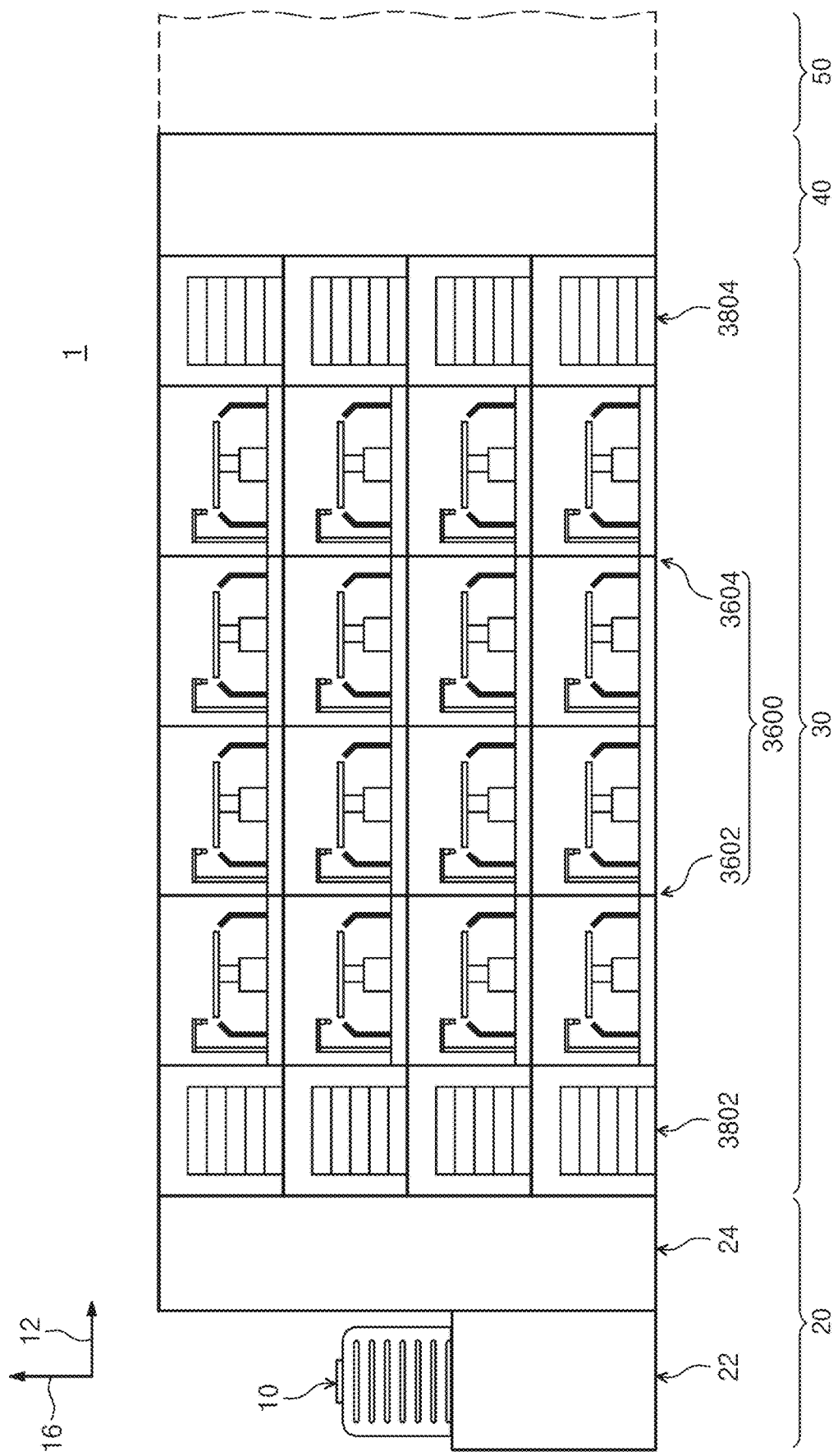
FIG. 4 is a front view of the substrate treating apparatus of FIG. 3.
Figure 5:
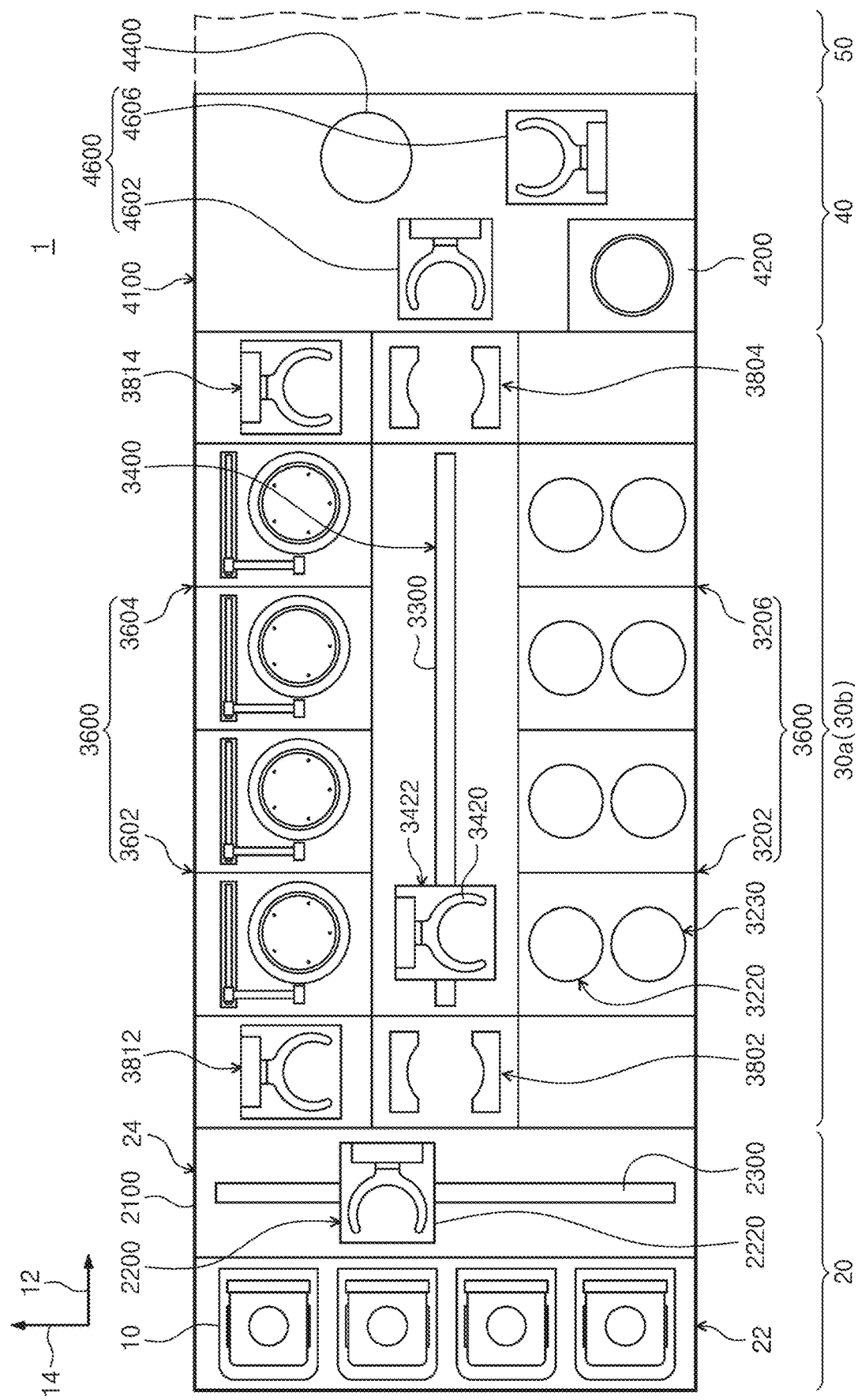
FIG. 5 is a plan view illustrating a coating block or a developing block of the substrate treating apparatus of FIG. 4.

FIG. 3 is a schematic perspective view illustrating a substrate treating apparatus according to an embodiment of the inventive concept. FIG. 4 is a front view of the substrate treating apparatus of FIG. 3. FIG. 5 is a plan view illustrating a coating block or a developing block of the substrate treating apparatus of FIG. 4.

Referring to FIGS. 3 to 5, the substrate treating apparatus 1 comprises an index module 20, a treating module 30, and an interface module 40. According to an embodiment, the index module 20, the treating module 30, and the interface module 40 are sequentially arranged in a row. Hereinafter, the direction in which the index module 20, the treating module 30, and the interface module 40 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 20 transfers substrates W received in containers 10 to the treating module 30 and places processed substrates W in the containers 10. The lengthwise direction of the index module 20 is parallel to the second direction 14. The index module 20 has a plurality of load ports 22 and an index frame 24. The load ports 22 are located on the opposite side to the treating module 30 with respect to the index frame 24. The containers 10 having the substrates W received therein are placed on the load ports 22. The plurality of load ports 22 may be arranged along the second direction 14.

Airtight containers 10 such as front open unified pods (FOUPs) may be used as the containers 10. The containers 10 may be placed on the load ports 22 by a transfer means (not illustrated), such as an overhead transfer, an overhead conveyor, or an automatic guided vehicle, or by an operator.

The index frame 24 has an index robot 2200 inside. A guide rail 2300, the lengthwise direction of which is parallel to the second direction 14, is provided in the index frame 24, and the index robot 2200 is movable on the guide rail 2300. The index robot 2200 comprises a hand 2220 on which a substrate W is placed, and the hand 2220 is movable forward and backward, rotatable about an axis oriented in the third direction 16, and movable along the third direction 16.

The treating module 30 performs a coating process and a developing process on a substrate W. The treating module 30 has coating blocks 30a and developing blocks 30b. Each of the coating blocks 30a performs a coating process on a substrate W, and each of the developing blocks 30b performs a developing process on the substrate W. The coating blocks 30a are stacked on each other. The developing blocks 30b are stacked on each other. According to the embodiment of FIG. 3, two coating blocks 30a and two developing block 30b are provided. The coating blocks 30a may be disposed under the developing blocks 30b. According to an embodiment, the two coating blocks 30a may perform the same process and may have the same structure. Furthermore, the two developing blocks 30b may perform the same process and may have the same structure.

Referring to FIG. 5, each of the coating blocks 30a has heat treatment chambers 3200, a transfer chamber 3400, liquid treating chambers 3600, and buffer chambers 3800. The heat treatment chambers 3200 perform heat treatment processes on a substrate W. The heat treatment processes may comprise a cooling process and a heating process. The liquid treating chambers 3600 form a liquid film on the substrate W by dispensing a liquid onto the substrate W. The liquid film may be a photoresist film or an anti-reflection film. The transfer chamber 3400 transfers the substrate W between the heat treatment chambers 3200 and the liquid treating chambers 3600 in the coating block 30a.

The lengthwise direction of the transfer chamber 3400 is parallel to the first direction 12. The transfer chamber 3400 has a transfer robot 3422 inside. The transfer robot 3422 transfers the substrate W between the heat treatment chambers 3200, the liquid treating chambers 3600, and the buffer chambers 3800. According to an embodiment, the transfer robot 3422 has a hand 3420 on which the substrate W is placed, and the hand 3420 is movable forward and backward, rotatable about an axis oriented in the third direction 16, and movable along the third direction 16. A guide rail 3300, the lengthwise direction of which is parallel to the first direction 12, is provided in the transfer chamber 3400, and the transfer robot 3422 is movable on the guide rail 3300.

Figure 6:
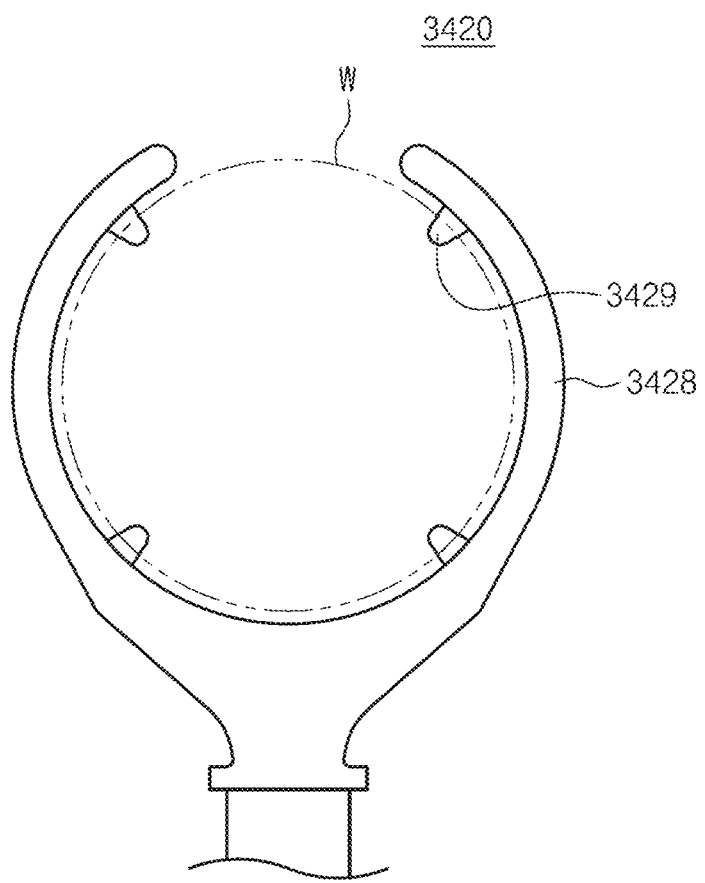
FIG. 6 is a view illustrating an example of a hand of a transfer robot of FIG. 5.

FIG. 6 is a view illustrating an example of the hand of the transfer robot of FIG. 5. Referring to FIG. 6, the hand 3420 has a base 3428 and support protrusions 3429. The base 3428 may have an annular ring shape, the circumference of which is partially curved. The base 3428 has an inner diameter larger than the diameter of the substrate W. The support protrusions 3429 extend inward from the base 3428. The support protrusions 3439 support the edge region of the substrate W. According to an embodiment, four support protrusions 3429 may be provided at equal intervals.

The plurality of heat treatment chambers 3200 are provided. Referring to FIGS. 4 and 5, the heat treatment chambers 3200 are arranged along the first direction 12. The heat treatment chambers 3200 are located on one side of the transfer chamber 3400.

Figure 7:
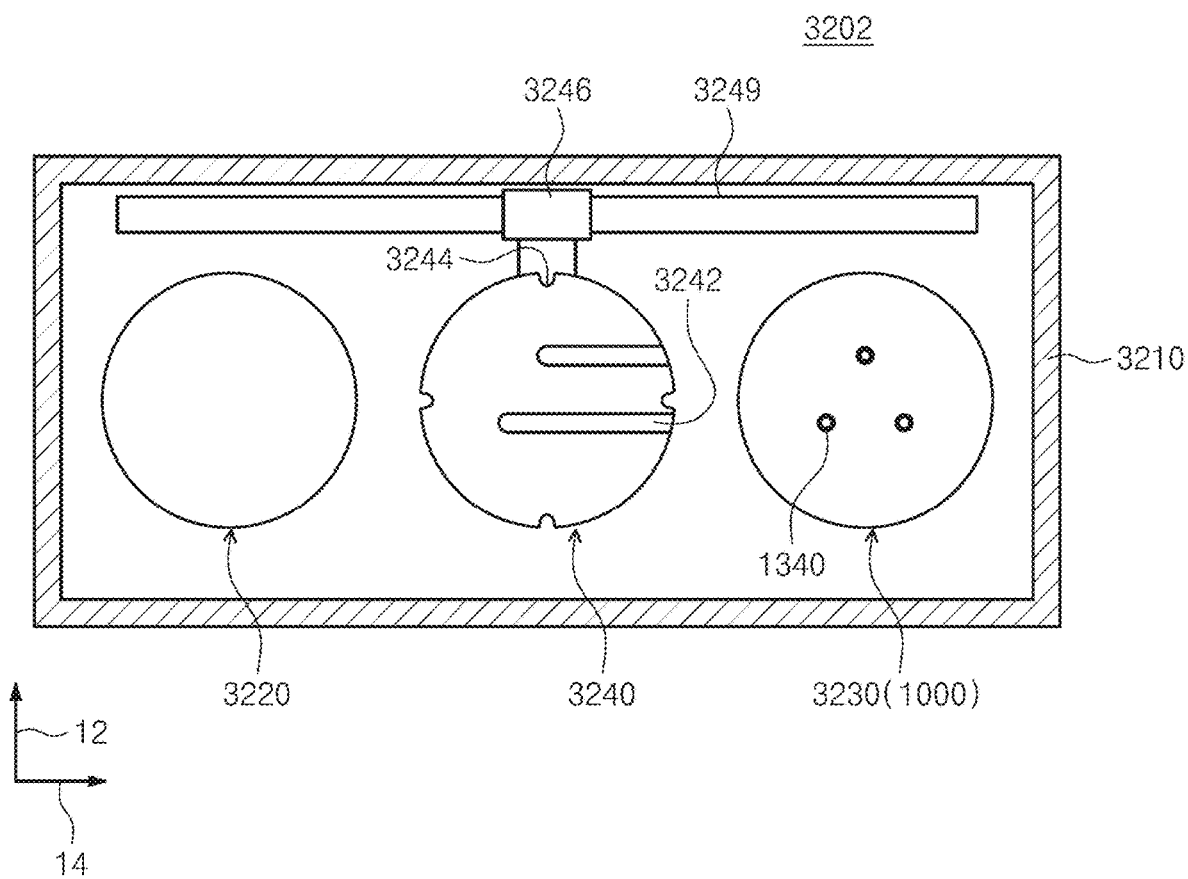
FIG. 7 is a schematic plan view illustrating an example of a heat treatment chamber of FIG. 5.
Figure 8:
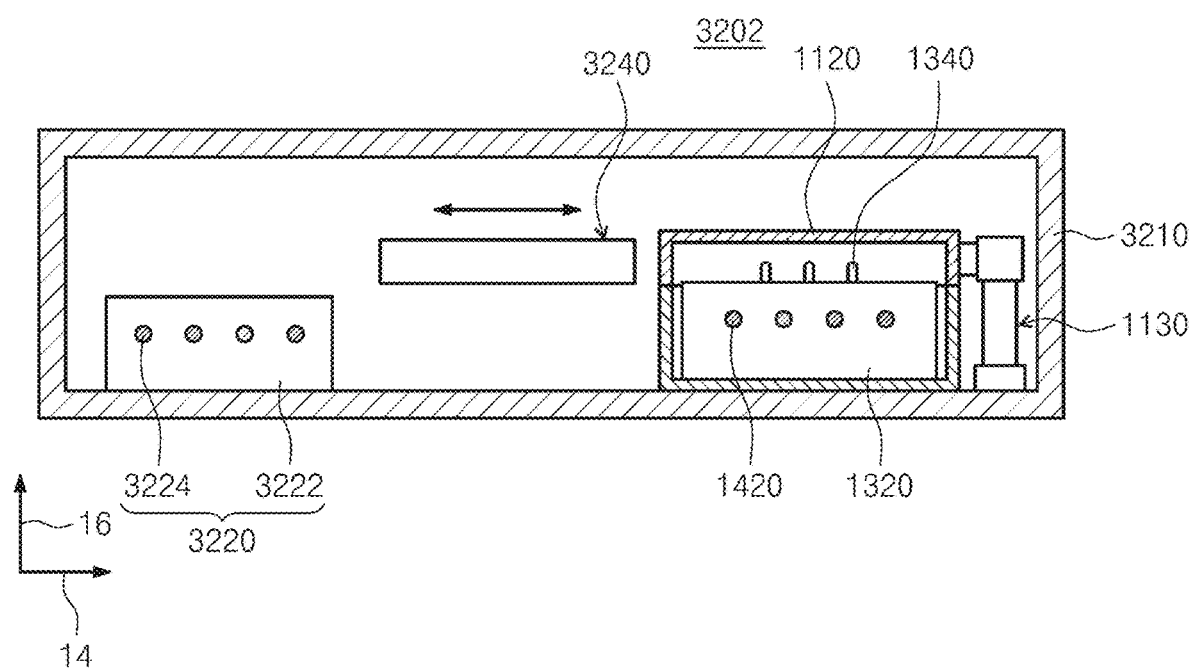
FIG. 8 is a front view of the heat treatment chamber of FIG. 5.

FIG. 7 is a schematic plan view illustrating an example of the heat treatment chambers of FIG. 5, and FIG. 8 is a front view of the heat treatment chamber of FIG. 7. The heat treatment chamber 3200 has a housing 3210, a cooling unit 3220, a heating unit 3230, and a transfer plate 3240.

The housing 3210 has a substantially rectangular parallelepiped shape. The housing 3210 has, in a sidewall thereof, an entrance (not illustrated) through which the substrate W is placed in or extracted from the housing 3210. The entrance may remain open. Alternatively, a door (not illustrated) for opening or closing the entrance may be provided. The cooling unit 3220, the heating unit 3230, and the transfer plate 3240 are provided in the housing 3210. The cooling unit 3220 and the heating unit 3230 are provided side by side along the second direction 14. According to an embodiment, the cooling unit 3220 may be located closer to the transfer chamber 3400 than the heating unit 3230.

The cooling unit 3220 has a cooling plate 3222. The cooling plate 3222 may have a substantially circular shape when viewed from above. The cooling plate 3222 has a cooling member 3224 therein. According to an embodiment, the cooling member 3224 may be formed in the cooling plate 3222 and may be provided as a passage through which a cooling fluid flows.

Figure 9:
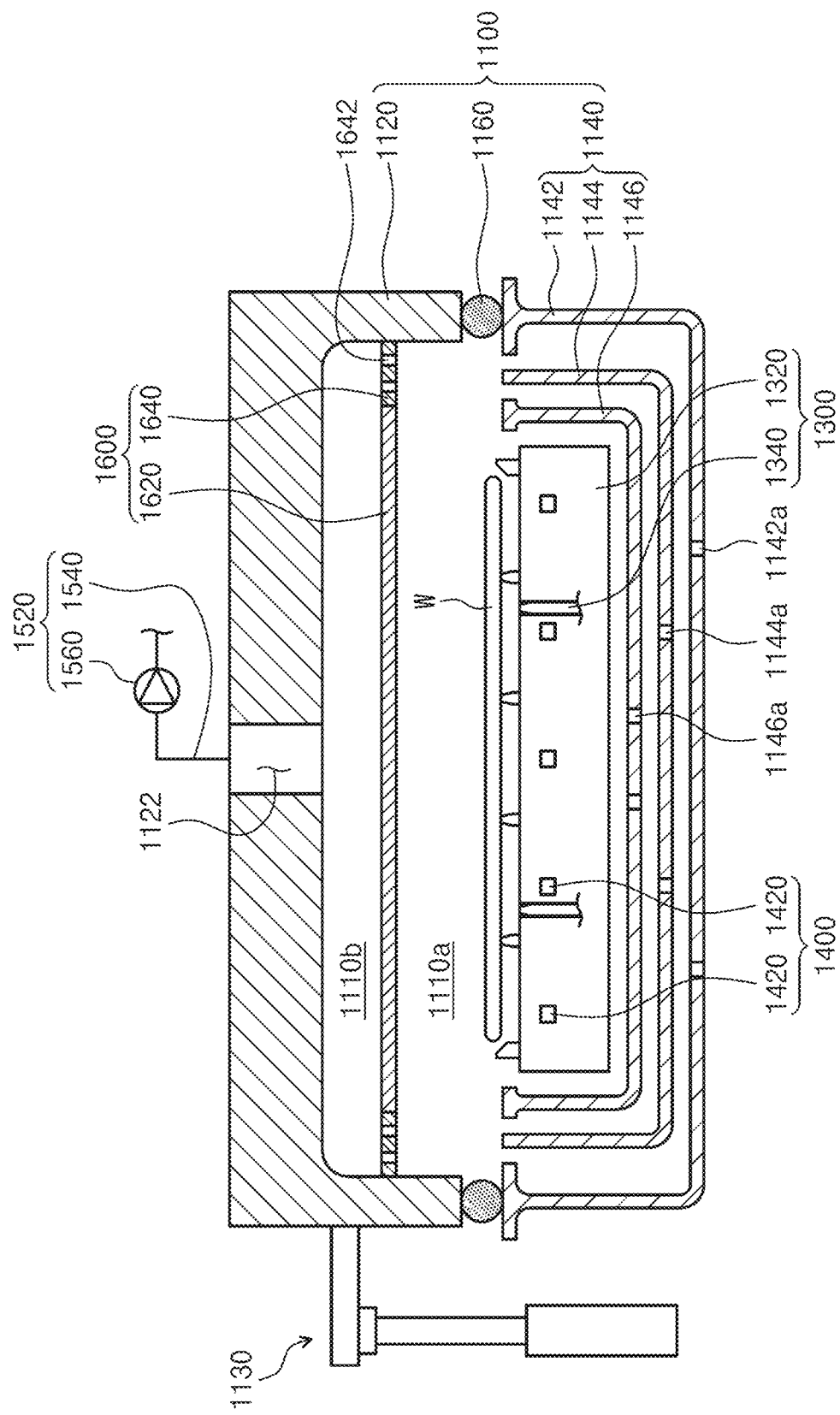
FIG. 9 is a sectional view illustrating a heating unit of FIG. 8.

The heating unit 3230 is provided as an apparatus 1000 that heats the substrate W to a temperature higher than the room temperature. The heating unit 3230 performs the heat treatment on the substrate W in the atmospheric atmosphere or in an atmosphere of reduced pressure lower than the atmospheric pressure. FIG. 9 is a schematic sectional view illustrating the heating unit. Referring to FIG. 9, the heating unit 1000 comprises a chamber 1100, a substrate support unit 1300, a heater unit 1400, an exhaust unit 1500, and a guide member 1600.

The chamber 1100 has a processing space 1110 in which the substrate W is heated. The processing space 1110 is sealed from the outside. The chamber 1100 comprises an upper body 1120, a lower body 1140, and a sealing member 1160.

The upper body 1120 has a cylindrical shape that is open at the bottom. An exhaust hole 1122 is formed in an upper wall of the upper body 1120. The exhaust hole 1122 is formed in the center of the upper body 1120. The exhaust hole 1122 evacuates the atmosphere in the processing space 1110. Accordingly, the processing space 1110 is evacuated by an upward flow evacuation method.

The lower body 1140 minimizes heat rejection from the heater unit 1400 to the outside. The lower body 1140 has a cylindrical shape that is open at the top. The lower body 1140 is located under the upper body 1120. The upper body 1120 and the lower body 1140 are combined with each other to form the processing space 1110 inside. The upper body 1120 and the lower body 1140 are located such that the central axes thereof are aligned with each other in the vertical direction.

The lower body 1140 comprises an inner container 1146, an intermediate container 1144, and an outer container 1142. The inner container 1146 has a cylindrical shape that surrounds the substrate support unit 1300. The inner container 1146 is located to be spaced apart from the substrate support unit 1300 by a predetermined distance. An upper end of the inner container 1146 may be at the same height as, or in a higher position than, the substrate support unit 1300. The intermediate container 1144 has a cylindrical shape that surrounds the inner container 1146. The intermediate container 1144 is located to be spaced apart from the inner container 1146 by a predetermined distance. An upper end of the intermediate container 1144 may be at the same height as the upper end of the inner container 1146. The outer container 1142 has a cylindrical shape that surrounds the intermediate container 1144. The outer container 1142 is located to be spaced apart from the intermediate container 1144 by a predetermined distance. An upper end of the outer container 1142 may be at the same height as, or in a higher position than, the upper end of the intermediate container 1144. A support (not illustrated) is installed between the containers adjacent to each other to support and separate the containers.

The containers 1142, 1144, and 1146 have inlet holes 1142a, 1144a, and 1146a, respectively, through which a gas flow is introduced from the outside. The space between the substrate support unit 1300 and the inner container 1146 and the spaces between the containers 1142, 1144, and 1146 function as introduction spaces into which the gas flow is introduced. For example, the inlet holes 1142a, 1144a, and 1146a may be arranged so as not to overlap each other when viewed from above. The inlet hole 1146a formed in the inner container 1146 may be located closer to the central axis of the substrate W than the inlet holes 1142a and 1144a formed in the intermediate container 1144 and the outer container 1142. Accordingly, the path lengths of the respective introduction spaces may be adjusted to be the same.

Alternatively, the inlet holes 1142a, 1144a, and 1146a may be arranged to overlap each other when viewed from above.

The outer container 1142 is located to face the upper body 1120 in the vertical direction. The outer container 1142 may have the same diameter as the upper body 1120. That is, the upper end of the outer container 1142 may be located to face a lower end of the upper body 1120.

One of the upper body 1120 and the outer container 1142 is moved between an open position and a closed position by a lifting member 1130, and the position of the other is fixed. In this embodiment, it is exemplified that the position of the outer container 1142 is fixed and the upper body 1120 is moved. The open position is a position in which the upper body 1120 and the outer container 1142 are spaced apart from each other so that the processing space 1110 is open. The closed position is a position in which the processing space 1110 is sealed from the outside by the outer container 1142 and the upper body 1120.

The sealing member 1160 is located between the upper body 1120 and the outer container 1142. The sealing member 1160 fills the gap between the upper body 1120, which is moved to the closed position, and the lower body 1140 to seal the processing space 1110 from the outside. The sealing member 1160 may have an annular ring shape. The sealing member 1160 may be fixedly attached to the upper end of the outer container 1142.

Figure 10:
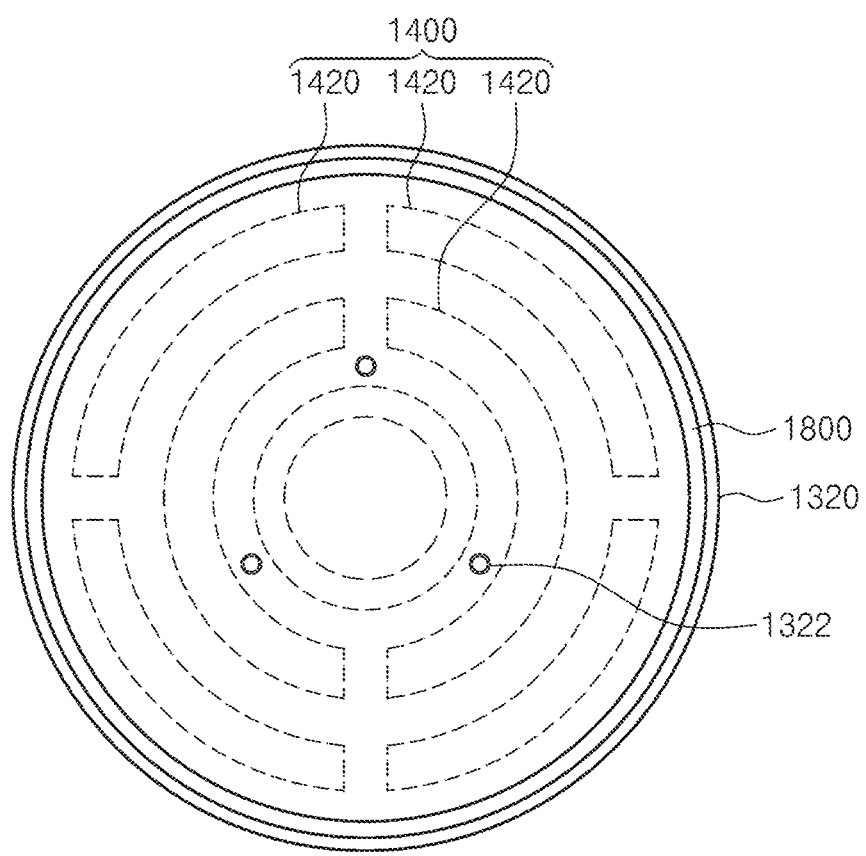
FIG. 10 is a plan view illustrating a substrate support unit of FIG. 9.

The substrate support unit 1300 supports the substrate W in the processing space 1110. The substrate support unit 1300 is fixedly combined with the lower body 1140. The substrate support unit 1300 comprises a support plate 1320 and a lift member 1340. FIG. 10 is a plan view illustrating the substrate support unit of FIG. 9. Referring to FIGS. 9 and 10, the support plate 1320 transfers heat generated from the heater unit 1400 to the substrate W. The support plate 1320 has a circular plate shape. An upper surface of the support plate 1320 has a larger diameter than the substrate W. The upper surface of the support plate 1320 functions as a seating surface 1320a on which the substrate W is placed. A plurality of lift holes 1322 are formed on the seating surface 1320a. The lift holes 1322 are arranged around the center of the upper surface of the support plate 1320 when viewed from above. The lift holes 1322 are arranged to be spaced circumferentially apart from each other. The lift holes 1322 may be spaced at equal intervals apart from each other.

For example, three lift holes 1322 may be provided. The support plate 1320 may be made of a material including aluminum nitride (AlN).

The lift member 1340 raises or lowers the substrate W on the support plate 1320. The lift member 1340 comprises a plurality of lift pins 1342 and an actuator (not illustrated). The plurality of lift pins 1342 have a pin shape that faces the vertical direction. The lift pins 1342 are located in the lift holes 1322, respectively. The actuator (not illustrated) moves the lift pins 1342 between a raised position and a lowered position. Here, the raised position is defined as a position in which upper ends of the lift pins 1342 are in a higher position than the seating surface 1320a, and the lowered position is defined as a position in which the upper ends of the lift pins 1342 are at the same height as, or in a lower position than, the seating surface 1320a. The actuator (not illustrated) may be located outside the chamber 1100. The actuator (not illustrated) may be a cylinder.

The heater unit 1400 heats the substrate W placed on the support plate 1320. The heater unit 1400 is located below the substrate W placed on the support plate 1320. The heater unit 1400 comprises a plurality of heaters 1420. The heaters 1420 are located in the support plate 1320. Alternatively, the heaters 1420 may be located on a bottom surface of the support plate 1320. The heaters 1420 are located on the same plane. The heaters 1420 heat different regions of the support plate 1320. The regions of the support plate 1320 that correspond to the respective heaters 1420 when viewed from above may be provided as heating zones. Some of the heating zones may be located in the central region of the support plate 1320, and the others may be located in the edge region of the support plate 1320. The temperatures of the respective heaters 1420 may be independently adjusted. For example, 15 heating zones may be provided. The temperature of each heating zone is measured by a measurement member (not illustrated). The heaters 1420 may be thermoelectric elements or heating wires.

The exhaust unit 1500 forcibly evacuates the interior of the processing space 1110. The exhaust unit 1500 comprises an exhaust tube 1530 and a pressure-reducing member 1560. The exhaust tube 1530 has a tubular shape, the lengthwise direction of which is parallel to the vertical direction. The exhaust tube 1530 is connected to the upper wall of the upper body 1120. For example, the exhaust tube 1530 may be inserted into the exhaust hole 1122. The pressure-reducing member 1560 is connected to the exhaust tube 1530. The pressure-reducing member 1560 reduces the pressure in the exhaust tube 1530. Accordingly, the atmosphere of the processing space 1110 divided by the guide member 1600 is evacuated while passing through a first space 1110a, a second space 1110b, and the exhaust tube 1530 in a serial order.

The guide member 1600 guides the gas flow in the processing space 1110. The guide member 1600 divides the processing space 1110 into the first space 1110a and the second space 1110b. Here, the first space 1110a is a lower space of the processing space 1110, and the second space 1110b is an upper space of the processing space 1110. For example, the first space 1110a may be a space between an upper surface of the substrate support unit 1300 and a bottom surface of the guide member 1600, and the second space 1110b may be a space between an upper surface of the guide member 1600 and the upper wall of the chamber 1100. The first space 1110a may be a space in which the substrate support unit 1300 is located, and the second space 1110b may be a space adjacent to the upper wall including the exhaust hole 1122. Accordingly, the gas flow in the processing space 1110 moves while sequentially passing through the first space 1110a, the second space 1110b, and the exhaust hole 1122. The guide member 1600 guides the gas flow introduced into the first space 1110a to allow the gas flow to move toward the second space 1110b without passing over an upper surface of the substrate W. However, the gas flow is not stagnant in the central region of the first space 1110a, but moves due to thermal expansion.

Figure 11:
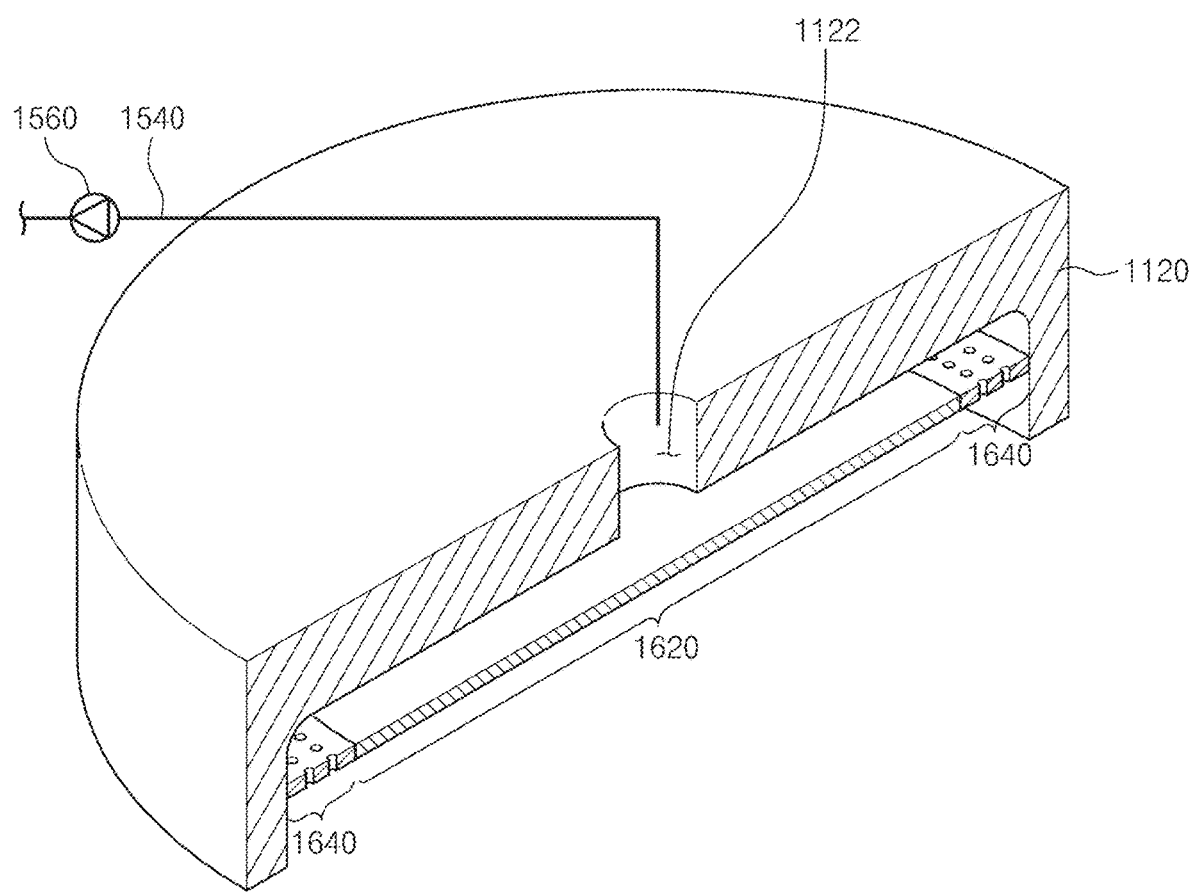
FIG. 11 is a sectional perspective view illustrating an upper body and a guide member of FIG. 9.
Figure 12:
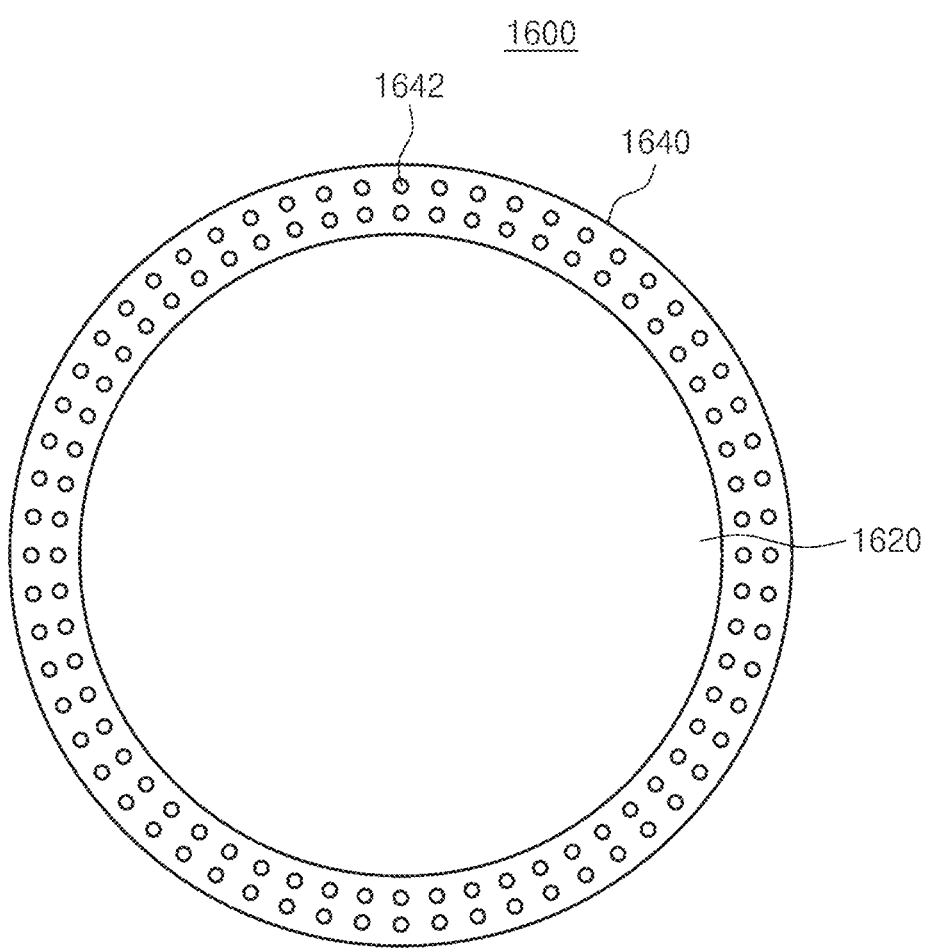
FIG. 12 is a plan view illustrating the guide member of FIG. 11.

FIG. 11 is a sectional perspective view illustrating the upper body and the guide member of FIG. 9. FIG. 12 is a plan view illustrating the guide member of FIG. 11. Referring to FIGS. 11 and 12, the guide member 1600 comprises a blocking plate 1620 and a baffle plate 1640. The blocking plate 1620 comprises a central region of the guide member 1600 that is a blocking region, and the baffle plate 1640 comprises an edge region of the guide member 1600 that surrounds the central region thereof. The blocking plate 1620 is located over the substrate support unit 1300 in the processing space 1110. The blocking plate 1620 has a plate shape that faces the substrate support unit 1300. The blocking plate 1620 has a diameter that is larger than that of the substrate W and smaller than the inner diameter of the chamber 1100. The blocking plate 1620 may be located to be spaced apart from an inner sidewall of the chamber 1100. The blocking plate 1620 is located to cover the substrate support unit 1300 when viewed from above. The blocking plate 1620 may be located such that the central axis thereof is aligned with the central axis of the chamber 1100. The baffle plate 1640 has a ring shape that surrounds the space between the blocking plate 1620 and the inner sidewall of the chamber 1100. The baffle plate 1640 extends from a lateral end of the blocking plate 1620 in the radial direction. The baffle plate 1640 has baffle holes 1642 vertically formed through the baffle plate 1640. The baffle holes 1642 are arranged along the circumferential direction of the baffle plate 1640. The baffle holes 1642 are arranged to form a ring shape by a combination thereof. The baffle holes 1642 may be arranged to cover the outside of the substrate support unit 1300 when viewed from above. The baffle holes 1642 may have a circular shape or a slit shape. The baffle holes 1642 may be arranged along the circumferential direction to form concentric circles. The baffle holes 1642 may have the same width. Alternatively, the baffle holes 1642 may have different widths depending on the distances from the central axis of the baffle plate 1640. According to an embodiment, the baffle plate 1640 may be located to be brought into contact with the blocking plate 1620 and the inner sidewall of the chamber 1100.

Figure 13:
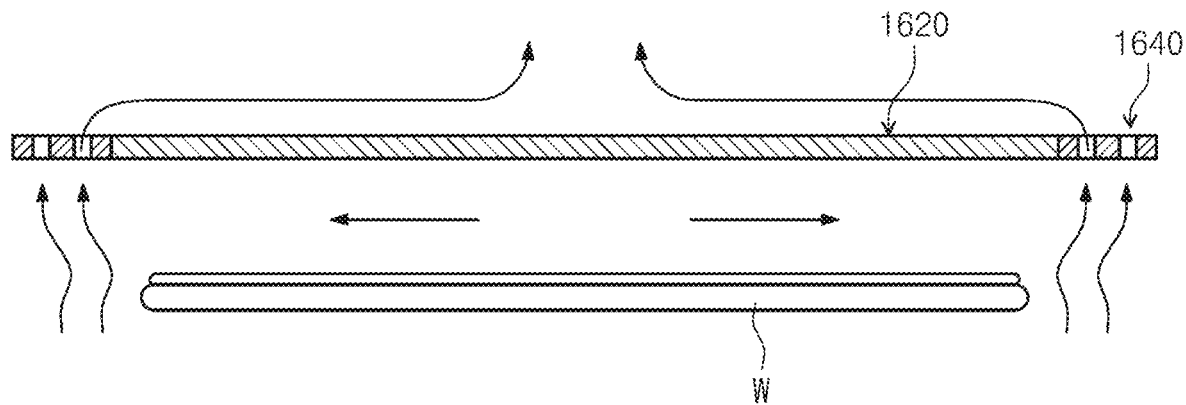
FIG. 13 is a view illustrating a gas flow in a processing space of FIG. 9.

Due to this, the gas flow introduced from outside the substrate support unit 1300 moves toward the baffle holes 1642 facing the edge region of the first space 1110a, without passing through the central region of the first space 1110a. A gas flow occurs in the central region of the first space 1110a due to thermal expansion, and the gas flow is formed as illustrated in FIG. 13. The gas flow that moves to the second space 1110b through the baffle holes 1642 is evacuated through the exhaust hole 1122.

Accordingly, even though the edge region of the substrate W is heated to a lower temperature than the central region of the substrate W, the amount of organic matter volatilized from a liquid film on the central region and the edge region of the substrate W may be uniformly adjusted due to the gas flow by the thermal expansion in the central region of the first space 1110a.

Furthermore, the gas flow is pre-heated while moving to the first space 1110a, because the gas flow is introduced through the inner container 1146 in which the heater unit 1400 is located, the intermediate container 1144 that surrounds the inner container 1146, and the outer container 1142 that surrounds the inner container 1146 and the intermediate container 1144. Accordingly, a temperature drop of the substrate W due to the gas flow introduced into the processing space 1110 may be minimized.

Figure 14:
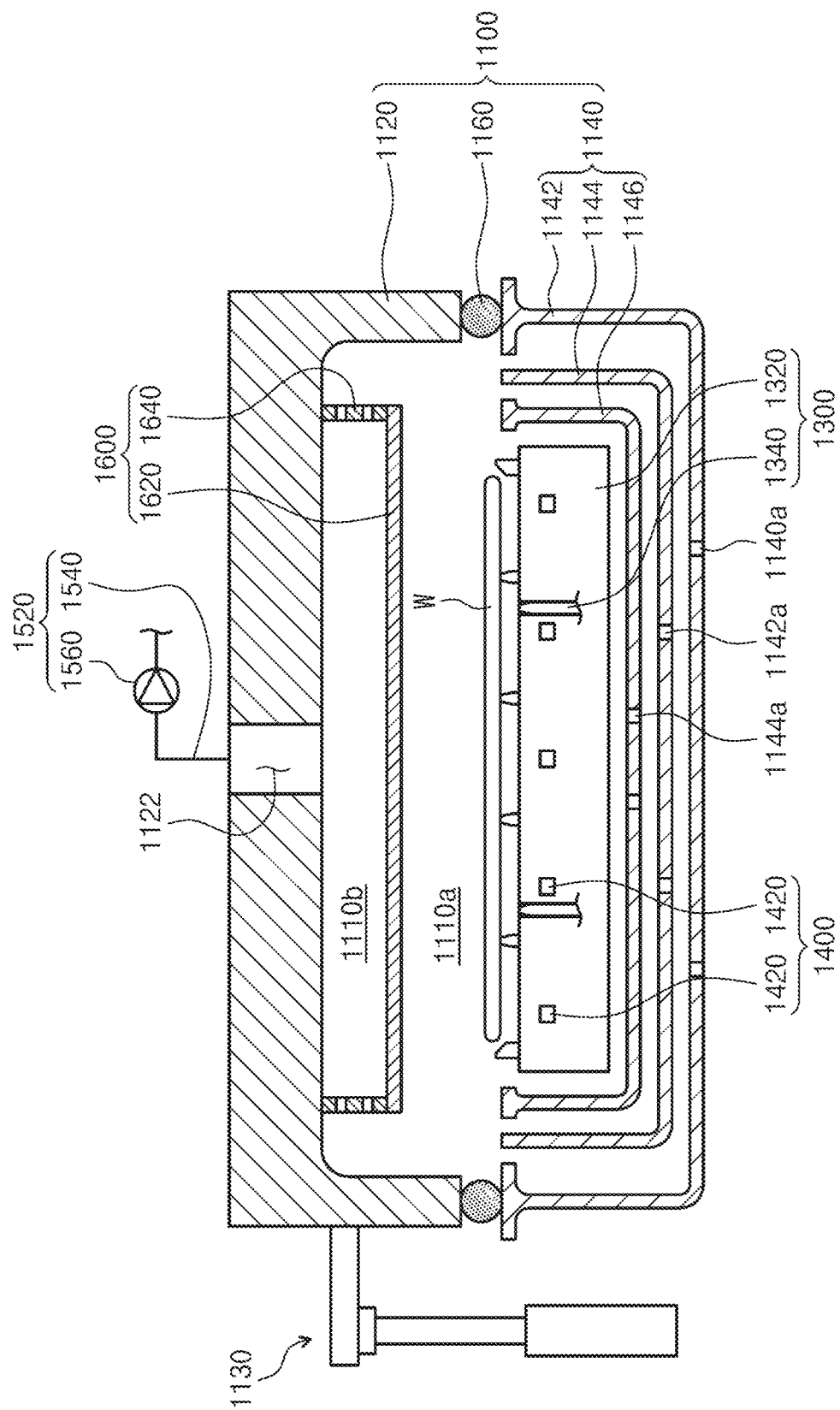
FIG. 14 is a sectional view illustrating another embodiment of the guide member of FIG. 9.

In the above-described embodiment, it has been exemplified that the baffle plate 1640 for evacuating the gas flow in the processing space 1110 upward through the edge region has a ring shape that extends from the distal end of the blocking plate 1620 in the radial direction. However, as illustrated in FIG. 14, the baffle plate 1640 for evacuating the gas flow in the processing space 1110 upward through the edge region may have a ring shape that extends upward from the distal end of the blocking plate 1620.

Referring again to FIGS. 7 and 8, the transfer plate 3240 has a substantially circular plate shape and has a diameter corresponding to that of the substrate W. The transfer plate 3240 has notches 3244 formed at the edge thereof. The notches 3244 may have a shape corresponding to that of the protrusions 3429 formed on the hand 3420 of the transfer robot 3422 described above. Furthermore, as many notches 3244 as the protrusions 3429, which are formed on the hand 3420, are formed in positions corresponding to the protrusions 3429. The substrate W is transferred between the hand 3420 and the transfer plate 3240 when the vertical positions of the hand 3420 and the transfer plate 3240 aligned with each other in the vertical direction are changed. The transfer plate 3240 may be mounted on a guide rail 3249 and may be moved between a first region 3212 and a second region 3214 along the guide rail 3249 by an actuator 3246. A plurality of guide grooves 3242 in a slit shape are formed in the transfer plate 3240. The guide grooves 3242 extend inward from the edge of the transfer plate 3240. The lengthwise direction of the guide grooves 3242 is parallel to the second direction 14, and the guide grooves 3242 are spaced apart from each other along the first direction 12. The guide grooves 3242 prevent interference between the transfer plate 3240 and the lift pins 1340 when the substrate W is transferred between the transfer plate 3240 and the heating unit 3230.

The substrate W is heated while the substrate W is directly placed on the support plate 1320. The substrate W is cooled while the transfer plate 3240 on which the substrate W is placed is brought into contact with the cooling plate 3222. The transfer plate 3240 is made of a material having a high heat transfer rate for efficient heat transfer between the cooling plate 3222 and the substrate W. According to an embodiment, the transfer plate 3240 may be made of metal.

The heating unit 3230 provided in some of the heat treatment chambers 3200 may improve adhesion of photoresist to the substrate W by supplying a gas while heating the substrate W. According to an embodiment, the gas may be a hexamethyldisilane gas.

Figure 15:
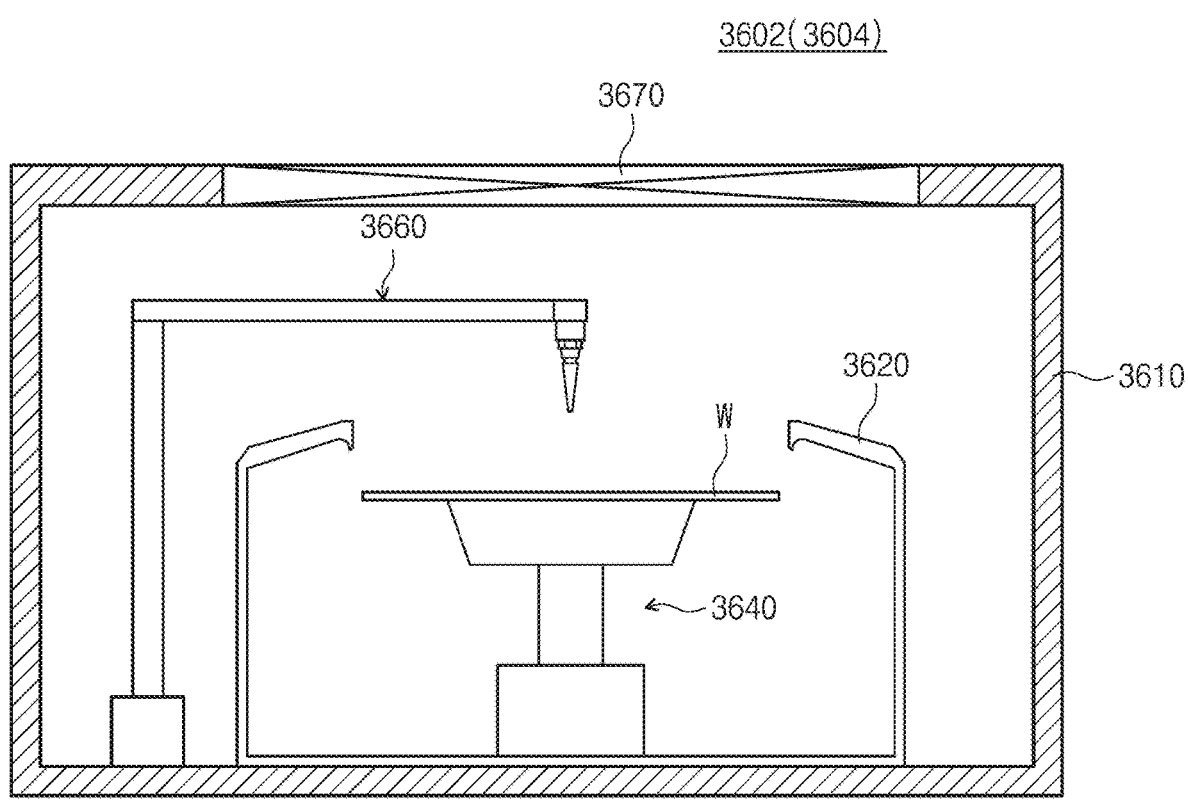
FIG. 15 is a schematic view illustrating an example of a liquid treating chamber of FIG. 4.

The plurality of liquid treating chambers 3600 are provided. Some of the liquid treating chambers 3600 may be stacked on each other. FIG. 15 is a schematic view illustrating an example of the liquid treating chambers.

Referring to FIGS. 4 and 5, the liquid treating chambers 3600 are disposed on an opposite side of the transfer chamber 3400. The liquid treating chambers 3600 are arranged side by side along the first direction 12. Some of the liquid treating chambers 3600 are located adjacent to the index module 20. Hereinafter, these liquid treating chambers are referred to as front liquid treating chambers 3602. Other liquid treating chambers 3600 are located adjacent to the interface module 40. Hereinafter, these liquid treating chambers are referred to as rear liquid treating chambers 3604.

The front liquid treating chambers 3602 apply a first liquid to the substrate W, and the rear liquid treating chambers 3604 apply a second liquid to the substrate W. The first liquid and the second liquid may be different types of liquids. According to an embodiment, the first liquid is an anti-reflection film, and the second liquid is photoresist. The photoresist may be applied to the substrate W coated with the anti-reflection film. Alternatively, the first liquid may be photoresist, and the second liquid may be an anti-reflection film. In this case, the anti-reflection film may be applied to the substrate W coated with the photoresist. In another case, the first liquid and the second liquid may be of the same type. Both the first liquid and the second liquid may be photoresist.

FIG. 15 is a schematic view illustrating an example of the liquid treating chambers of FIG. 4. Referring to FIG. 15, the liquid treating chambers 3602 and 3604 have a housing 3610, a cup 3620, a support unit 3640, and a liquid dispensing unit 3660. The housing 3610 has a substantially rectangular parallelepiped shape. The housing 3610 has, in a sidewall thereof, an entrance (not illustrated) through which the substrate W is placed in or extracted from the housing 3610. The entrance may be opened or closed by a door (not illustrated). The cup 3620, the support unit 3640, and the liquid dispensing unit 3660 are provided in the housing 3610. A fan filter unit 3670 may be provided on an upper wall of the housing 3610 to form a downward flow of gas in the housing 3610. The cup 3620 has a processing space that is open at the top. The support unit 3640 is disposed in the processing space and supports the substrate W. The support unit 3640 rotates the substrate W during liquid treating. The liquid dispensing unit 3660 dispenses a liquid onto the substrate W supported on the support unit 3640.

Referring again to FIGS. 4 and 5, the plurality of buffer chambers 3800 are provided. Some of the buffer chambers 3800 are disposed between the index module 20 and the transfer chamber 3400. Hereinafter, these buffer chambers are referred to as front buffers 3802. The plurality of front buffers 3802 are stacked one above another along the vertical direction. The other buffer chambers are disposed between the transfer chamber 3400 and the interface module 40. Hereinafter, these buffer chambers are referred to as rear buffers 3804. The plurality of rear buffers 3804 are stacked one above another along the vertical direction. The front buffers 3802 and the rear buffers 3804 each temporarily store a plurality of substrates W. The substrates W stored in the front buffers 3802 are extracted by the index robot 2200 and the transfer robot 3422. The substrates W stored in the rear buffers 3804 are extracted by the transfer robot 3422 and a first robot 4602.

Each of the developing blocks 30b has heat treatment chambers 3200, a transfer chamber 3400, and liquid treating chambers 3600. The heat treatment chambers 3200, the transfer chamber 3400, and the liquid treating chambers 3600 of the developing block 30b are provided in a structure and arrangement similar to the structure and arrangement of the heat treatment chambers 3200, the transfer chamber 3400, and the liquid treating chambers 3600 of the coating block 30a. Therefore, detailed descriptions thereabout will be omitted. However, all the liquid treating chambers 3600 in the developing block 30*b* are provided as developing chambers 3600 that perform a developing process on a substrate by dispensing a developing solution onto the substrate.

The interface module 40 connects the treating module 30 to an external stepper 50. The interface module 40 has an interface frame 4100, additional process chambers 4200, interface buffers 4400, and a transfer member 4600.

The interface frame 4100 may have, at the top thereof, a fan filter unit that forms a downward flow of gas in the interface frame 4100. The additional process chambers 4200, the interface buffers 4400, and the transfer member 4600 are disposed in the interface frame 4100. The additional process chambers 4200 may perform a predetermined additional process on the substrate W processed in the coating block 30*a* before the substrate W is transferred to the stepper 50. Alternatively, the additional process chambers 4200 may perform a predetermined additional process on the substrate W processed in the stepper 50 before the substrate W is transferred to the developing block 30*b*. According to an embodiment, the additional process may be an edge exposing process of exposing the edge region of the substrate W to light, a front-side cleaning process of cleaning the front side of the substrate W, or a back-side cleaning process of cleaning the back side of the substrate W. The plurality of additional process chambers 4200 may be stacked one above another. The additional process chambers 4200 may all perform the same process. Alternatively, some of the additional process chambers 4200 may perform different processes.

The interface buffers 4400 provide a space in which the substrate W transferred between the coating block 30*a*, the additional process chambers 4200, the stepper 50, and the developing block 30*b* temporarily stay. The plurality of interface buffers 4400 may be stacked one above another.

According to an embodiment, the additional process chambers 4200 may be disposed on one side of an extension line that extends in the lengthwise direction of the transfer chamber 3400, and the interface buffers 4400 may be disposed on the other side of the extension line.

The transfer member 4600 transfers the substrate W between the coating block 30*a*, the additional process chambers 4200, the stepper 50, and the developing block 30*b*. The transfer member 4600 may be implemented with one or more robots. According to an embodiment, the transfer member 4600 has the first robot 4602 and a second robot 4606. The first robot 4602 may transfer the substrate W between the coating block 30*a*, the additional process chambers 4200, and the interface buffers 4400. An interface robot 4606 may transfer the substrate W between the interface buffers 4400 and the stepper 50. The second robot 4606 may transfer the substrate W between the interface buffers 4400 and the developing block 30*b*.

The first robot 4602 and the second robot 4606 each comprise a hand on which the substrate W is placed, and the hand is movable forward and backward, rotatable about an axis parallel to the third direction 16, and movable along the third direction 16.

The hands of the index robot 2200, the first robot 4602, and the second robot 4606 may all have the same shape as the hand 3420 of the transfer robot 3422. Alternatively, the hand of a robot that directly exchanges the substrate W with the transfer plate 3240 of each heat treatment chamber may have the same shape as the hand 3420 of the transfer robot 3422, and the hands of the remaining robots may have different shapes from the hand 3420 of the transfer robot 3422.

According to an embodiment, the index robot 2200 may directly exchange the substrate W with the heating units 3230 of the front heat treatment chambers 3200 in the coating block 30*a*.

Furthermore, the transfer robots 3422 in the coating block 30*a* and the developing block 30*b* may directly exchange the substrate W with the transfer plates 3240 located in the heat treatment chambers 3200.

Next, an embodiment of a method for treating a substrate using the above-described substrate treating apparatus 1 will be described.

Coating process S20, edge exposing process S40, exposing process S60, and developing process S80 are sequentially performed on the substrate W.

Coating process S20 is performed by sequentially performing heat treatment process S21 in the heat treatment chamber 3200, anti-reflection film coating process S22 in the front liquid treating chamber 3602, heat treatment process S23 in the heat treatment chamber 3200, photoresist film coating process S24 in the rear liquid treating chamber 3604, and heat treatment process S25 in the heat treatment chamber 3200.

Hereinafter, an example of a transfer path of the substrate W from the container 10 to the stepper 50 will be described.

The index robot 2200 extracts the substrate W from the container 10 and transfers the substrate W to the front buffer 3802. The transfer robot 3422 transfers the substrate W stored in the front buffer 3802 to the front heat treatment chamber 3200. The substrate W is transferred to the heating unit 3230 by the transfer plate 3240. When a heating process is completely performed on the substrate W in the heating unit 3230, the transfer plate 3240 transfers the substrate W to the cooling unit 3220. The transfer plate 3240 is brought into contact with the cooling unit 3220 and performs a cooling process on the substrate W supported on the transfer plate 3240. When the cooling process is completed, the transfer plate 3240 moves above the cooling unit 3220, and the transfer robot 3422 extracts the substrate W from the heat treatment chamber 3200 and transfers the substrate W to the front liquid treating chamber 3602.

The front liquid treating chamber 3602 coats the substrate W with an anti-reflection film.

The transfer robot 3422 extracts the substrate W from the front liquid treating chamber 3602 and places the substrate W in the heat treatment chamber 3200. The heat treatment chamber 3200 sequentially performs the above-described heating and cooling processes. When the heat treatment processes are completed, the transfer robot 3422 extracts the substrate W from the heat treatment chamber 3200 and places the substrate W in the rear liquid treating chamber 3604.

Thereafter, the rear liquid treating chamber 3604 coats the substrate W with a photoresist film.

The transfer robot 3422 extracts the substrate W from the rear liquid treating chamber 3604 and places the substrate W in the heat treatment chamber 3200. The heat treatment chamber 3200 sequentially performs the above-described heating and cooling processes. When the heat treatment processes are completed, the transfer robot 3422 transfers the substrate W to the rear buffer 3804. The first robot 4602 of the interface module 40 extracts the substrate W from the rear buffer 3804 and transfers the substrate W to the additional process chamber 4200.

The additional process chamber 4200 performs an edge exposing process on the substrate W.

The first robot 4602 extracts the substrate W from the additional process chamber 4200 and transfers the substrate W to the interface buffer 4400.

The second robot 4606 extracts the substrate W from the interface buffer 4400 and transfers the substrate W to the stepper 50.

Developing process S80 is performed by sequentially performing heat treatment process S81 in the heat treatment chamber 3200, developing process S82 in the liquid treating chamber 3600, and heat treatment process S83 in the heat treatment chamber 3200.

Hereinafter, an example of a transfer path of the substrate W from the stepper 50 to the container 10 will be described.

The second robot 4606 extracts the substrate W from the stepper 50 and transfers the substrate W to the interface buffer 4400.

The first robot 4602 extracts the substrate W from the interface buffer 4400 and transfers the substrate W to the rear buffer 3804. The transfer robot 3422 extracts the substrate W from the rear buffer 3804 and transfers the substrate W to the heat treatment chamber 3200. The heat treatment chamber 3200 sequentially performs a heating process and a cooling process on the substrate W. When the cooling process is completed, the substrate W is transferred to the developing chamber 3600 by the transfer robot 3422.

The developing chamber 3600 performs a developing process by dispensing a developing solution onto the substrate W.

The substrate W is extracted from the developing chamber 3600 and placed in the heat treatment chamber 3200 by the transfer robot 3422. The heat treatment chamber 3200 sequentially performs a heating process and a cooling process on the substrate W. When the cooling process is completed, the substrate W is extracted from the heat treatment chamber 3200 and transferred to the front buffer 3802 by the transfer robot 3422.

The index robot 2200 extracts the substrate W from the front buffer 3802 and transfers the substrate W to the container 10.

The treating module 30 of the substrate treating apparatus 1 has been described as performing the coating process and the developing process. However, the substrate treating apparatus 1 may comprise only the index module 20 and the treating module 30 without the interface module 40. In this case, the treating module 30 may perform only the coating process, and the film with which the substrate W is coated may be a spin-on hardmask (SOH) film.

According to the embodiments of the inventive concept, the gas flow in the chamber is evacuated upward through the outside of the substrate. Thus, the inventive concept may prevent a temperature difference between regions of the substrate due to the gas flow.

Furthermore, according to the embodiments of the inventive concept, the gas flow is introduced into the processing space through the regions adjacent to the heaters. Thus, the inventive concept may minimize a temperature drop of the substrate due to the gas flow.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims comprise other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a process chamber having a processing space inside;
   a substrate support unit configured to support the substrate in the processing space;
   a heating unit configured to heat the substrate supported on the substrate support unit;
   an exhaust unit configured to evacuate the processing space; and
   a guide member configured to guide a gas flow in the processing space,
   wherein the guide member comprises a blocking plate located between an upper wall of the process chamber and the substrate support unit and spaced apart from an inner sidewall of the process chamber, the blocking plate having a diameter smaller than an inner diameter of the process chamber and having no openings, and
   wherein the exhaust unit is connected, at a position overlapping the blocking plate, to the upper wall of the process chamber when viewed from above.

2. The apparatus of claim 1, wherein the guide member further comprises a baffle plate located in a spacing space between the blocking plate and the inner sidewall of the process chamber,
   wherein the baffle plate is located to be brought into contact with the blocking plate and the inner sidewall of the process chamber, and
   wherein the baffle plate has a plurality of baffle holes extending through opposite ends of the baffle plate.

3. The apparatus of claim 1, wherein the guide member further comprises a baffle plate located in a spacing space between the blocking plate and the upper wall of the process chamber,
   wherein the baffle plate is located to be brought into contact with the blocking plate and the upper wall of the process chamber, and
   wherein the baffle plate has a plurality of baffle holes extending through opposite ends of the baffle plate.

4. The apparatus of claim 1, wherein the process chamber comprises:
   an upper body to which the exhaust unit is connected; and
   a lower body combined with the upper body to form the processing space inside,
   wherein the lower body comprises:
   an inner container configured to surround a side portion and a lower portion of the substrate support unit;
   an outer container configured to surround the inner container and vertically face the upper body; and an intermediate container configured to surround the inner container and located between the inner container and the outer container, wherein the substrate support unit, the inner container, the intermediate container, and the outer container are located to be spaced apart from each other, and wherein the inner container, the intermediate container, and the outer container have inflow holes, respectively, through which the gas flow is introduced from outside the process chamber.

5. An apparatus for treating a substrate, the apparatus comprising:

a process chamber having a processing space inside;

a substrate support unit configured to support the substrate in the processing space;

a heating unit configured to heat the substrate supported on the substrate support unit;

an exhaust unit configured to evacuate the processing space; and a guide member configured to guide a gas flow in the processing space, wherein the guide member partitions the processing space into a first space and a second space, and the guide member has no openings, wherein the exhaust unit is connected to an exhaust hole formed in an upper wall of the process chamber, wherein the guide member has baffle holes configured to connect the first space and the second space, wherein the substrate support unit is located in the first space, and wherein the second space is adjacent to the upper wall of the process chamber that comprises the exhaust hole.

6. The apparatus of claim 5, wherein the guide member comprises a blocked central region and an edge region in which the baffle holes are formed.

7. The apparatus of claim 6, wherein the edge region is arranged outside the substrate support unit when viewed from above.

8. The apparatus of claim 7, wherein the central region and the edge region are located on the same plane.

9. The apparatus of claim 7, wherein the edge region extends upward from a distal end of the central region.

10. An apparatus for treating a substrate, the apparatus comprising:

a process chamber having a processing space inside;

a substrate support unit configured to support the substrate in the processing space;

a heating unit configured to heat the substrate supported on the substrate support unit;

an exhaust unit configured to evacuate the processing space; and a guide member configured to guide a gas flow in the processing space, wherein the guide member comprises a blocking plate located between an upper wall of the process chamber and the substrate support unit, and wherein the exhaust unit is connected to the upper wall of the process chamber when viewed from above, wherein the process chamber comprises an upper body to which the exhaust unit is connected; and a lower body combined with the upper body to form the processing space inside, wherein the lower body comprises an inner container configured to surround a side portion and a lower portion of the substrate support unit;

an outer container configured to surround the inner container and vertically face the upper body; and an intermediate container configured to surround the inner container and located between the inner container and the outer container.

11. The apparatus of claim 10, wherein the guide member further comprises a baffle plate located in a spacing space between the blocking plate and an inner sidewall of the process chamber, wherein the baffle plate is located to be brought into contact with the blocking plate and the inner sidewall of the process chamber, and wherein the baffle plate has a plurality of baffle holes extending through opposite ends of the baffle plate.

12. The apparatus of claim 10, wherein the guide member further comprises a baffle plate located in a spacing space between the blocking plate and the upper wall of the process chamber, wherein the baffle plate is located to be brought into contact with the blocking plate and the upper wall of the process chamber, and wherein the baffle plate has a plurality of baffle holes extending through opposite ends of the baffle plate.

* * * * *